(12) United States Patent
Nagano et al.

(10) Patent No.: US 11,205,948 B2
(45) Date of Patent: Dec. 21, 2021

(54) GATE DRIVER AND POWER CONVERTER

(71) Applicant: FUJI ELECTRIC CO., LTD., Kanagawa (JP)

(72) Inventors: Tsuyoshi Nagano, Tokyo (JP); Kunio Matsubara, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/029,404

(22) Filed: Sep. 23, 2020

(65) Prior Publication Data

US 2021/0006146 A1    Jan. 7, 2021

Related U.S. Application Data

(63) Continuation of application No. 16/800,083, filed on Feb. 25, 2020, now Pat. No. 10,819,212.

(30) Foreign Application Priority Data

Jun. 24, 2019  (JP) .............................. JP2019-116691

(51) Int. Cl.
| | |
|---|---|
| *H02M 1/08* | (2006.01) |
| *H02M 3/335* | (2006.01) |
| *H03K 17/687* | (2006.01) |
| *H03K 17/0412* | (2006.01) |
| *H02M 1/00* | (2006.01) |

(52) U.S. Cl.
CPC .............. *H02M 1/08* (2013.01); *H02M 3/335* (2013.01); *H03K 17/04123* (2013.01); *H03K 17/687* (2013.01); *H02M 1/0006* (2021.05); *H02M 1/0025* (2021.05)

(58) Field of Classification Search
CPC .. H02M 1/08; H02M 3/335; H03K 17/04123; H03K 17/687
See application file for complete search history.

(56) References Cited

U.S. PATENT DOCUMENTS

| | | | | |
|---|---|---|---|---|
| 4,237,420 A | * | 12/1980 | Ebihara | .................. G01K 1/028 307/651 |
| 4,257,007 A | * | 3/1981 | Brooks | ................ H03H 19/008 327/2 |
| 4,860,148 A | * | 8/1989 | Iwamura | ............. H01L 27/0248 361/58 |
| 5,493,486 A | * | 2/1996 | Connell | .................. H02M 3/07 307/110 |
| 5,656,870 A | * | 8/1997 | Turnbull | ................. H02M 3/28 307/64 |
| 5,867,376 A | * | 2/1999 | Nakamura | .............. H02M 7/48 363/56.01 |

(Continued)

FOREIGN PATENT DOCUMENTS

| | | |
|---|---|---|
| JP | 4935266 | 5/2012 |
| JP | 6398537 | 10/2018 |

*Primary Examiner* — Adam D Houston
(74) *Attorney, Agent, or Firm* — IPUSA, PLLC

(57) ABSTRACT

A gate driver includes: a timing determination unit configured to measure an on-time of a switching element and configured to determine, based on the on-time, a certain timing during a turn-off period of the switching element as an intermediate timing; and a driving condition changing unit configured to change a gate driving condition of the switching element at the intermediate timing determined by the timing determination unit.

4 Claims, 4 Drawing Sheets

(56) References Cited

U.S. PATENT DOCUMENTS

| | | | | |
|---|---|---|---|---|
| 6,683,494 B2* | 1/2004 | Stanley | ............... | H03F 3/2175 |
| | | | | 330/10 |
| 6,912,139 B2* | 6/2005 | Kernahan | ............ | H03K 23/005 |
| | | | | 363/41 |
| 7,365,523 B2* | 4/2008 | Malherbe | ............ | G06K 19/073 |
| | | | | 307/110 |
| 7,816,814 B1* | 10/2010 | Hennessy | ............. | H03K 17/92 |
| | | | | 307/112 |
| 9,716,430 B1* | 7/2017 | Trescases | ............ | H03K 17/687 |
| 10,819,212 B1* | 10/2020 | Nagano | ................ | H02M 1/08 |
| 2009/0200874 A1* | 8/2009 | Takai | .................. | H02M 3/07 |
| | | | | 307/109 |
| 2016/0352237 A1* | 12/2016 | Quigley | ............ | H02M 3/33507 |
| 2017/0076760 A1* | 3/2017 | Yabuuchi | ........... | H01L 27/0207 |
| 2017/0288552 A1* | 10/2017 | Hari | ................. | H02M 3/33507 |
| 2017/0302153 A1* | 10/2017 | Mochiki | .............. | B60L 15/007 |
| 2017/0353097 A1* | 12/2017 | Lai | ...................... | H05B 45/385 |
| 2018/0019611 A1* | 1/2018 | Zhang | .................. | H02J 7/0071 |
| 2018/0059151 A1* | 3/2018 | Trescases | ............. | G01R 15/08 |
| 2018/0062633 A1* | 3/2018 | Nomura | ................ | H03K 3/012 |
| 2018/0123441 A1* | 5/2018 | Yanai | .................... | G05B 15/02 |
| 2018/0323714 A1* | 11/2018 | Johnson | ................ | H02M 1/08 |
| 2018/0367023 A1* | 12/2018 | Terashima | ............. | H02M 1/08 |
| 2018/0375423 A1* | 12/2018 | Ikeda | .................... | H02M 7/537 |
| 2019/0140637 A1* | 5/2019 | Chen | .................... | H03K 17/063 |
| 2020/0014215 A1* | 1/2020 | Fujimura | ................ | H02J 3/00 |
| 2020/0021282 A1* | 1/2020 | Yamamoto | ........... | H03K 17/168 |
| 2020/0044032 A1* | 2/2020 | Haeberlen | ........... | H01L 29/2003 |
| 2020/0161962 A1* | 5/2020 | Liu | ....................... | H02M 7/062 |
| 2020/0313563 A1* | 10/2020 | Hyugaji | ............... | H02M 3/33592 |
| 2021/0013792 A1* | 1/2021 | Matsubara | .......... | H03K 17/0822 |
| 2021/0119539 A1* | 4/2021 | Hasegawa | ............ | B60L 53/20 |
| 2021/0143812 A1* | 5/2021 | Matsubara | ........... | H03K 17/284 |

* cited by examiner

GATE DRIVER AND POWER CONVERTER

CROSS-REFERENCE TO RELATED APPLICATION

The present application is a continuation application of U.S. patent application Ser. No. 16/800,083 filed on Feb. 25, 2020, which is based upon and claims priority to Japanese Patent Application No. 2019-116691, filed on Jun. 24, 2019. The entire contents of the applications are incorporated herein by reference.

BACKGROUND OF THE INVENTION

1. Field of the Invention

The present invention relates to a gate driver and a power converter.

2. Description of the Related Art

Conventionally, in order to reduce surge voltage and switching losses, an active gate driving technique is known, in which switching speed is changed at an appropriate timing in accordance with drain current or collector current (which may be referred to as main current hereinafter) flowing through a switching element. For example, Patent Document 1 discloses a gate drive circuit that stores a surge period from a timing of a turn-off command to an occurrence timing of voltage surge. At the time of current turn-off, the gate drive circuit determines a timing of changing effective gate resistance of the switching element, based on the surge period stored at the time of previous turn-off.

On the other hand, in a power converter such as a chopper circuit, there is known a technique for using, depending on the purpose, a current continuous mode in which current flowing through a reactor is continuous and a current discontinuous mode in which current flowing through a reactor is intermittent (see, for example, Patent Document 2).

RELATED-ART DOCUMENTS

Patent Document

[Patent Document 1] Japanese Patent No. 4935266
[Patent Document 2] Japanese Patent No. 6398537

In the conventional active gate driving technique, it is assumed that the present current value of the main current at the start time point of turn-off is the same as the previous current value of the main current at the start time point of turn-off. However, in a driving mode (e.g., a current discontinuous mode) in which the current value of the main current at the start time point of turn-off may differ between the present time and the previous time, a timing that is appropriate for varying the switching speed to achieve suppression of the switch-off surge voltage and reduction of the switching losses varies on a case-by-case basis. Accordingly, active gate driving cannot be performed at an appropriate time, and it may be difficult to both suppress the switch-off surge voltage and reduce the switching losses.

Accordingly, the present disclosure provides a gate driver and a power converter that can achieve both suppression of switch-off surge voltage and reduction of switching losses, by changing the switching speed at an appropriate timing.

SUMMARY OF THE INVENTION

The present disclosure provides a gate driver including: a timing determination unit configured to measure an on-time of a switching element and configured to determine, based on the on-time, a certain timing during a turn-off period of the switching element as an intermediate timing; and a driving condition changing unit configured to change a gate driving condition of the switching element at the intermediate timing determined by the timing determination unit.

According to the present disclosure, because it is possible to change the switching speed at an appropriate timing, it is possible to provide a gate driver and a power converter that can achieve both suppression of switch-off surge voltage and reduction of switching losses.

DETAILED DESCRIPTION OF THE EMBODIMENTS

In the following, an embodiment according to the present disclosure will be described with reference to the drawings.

Figure 1:
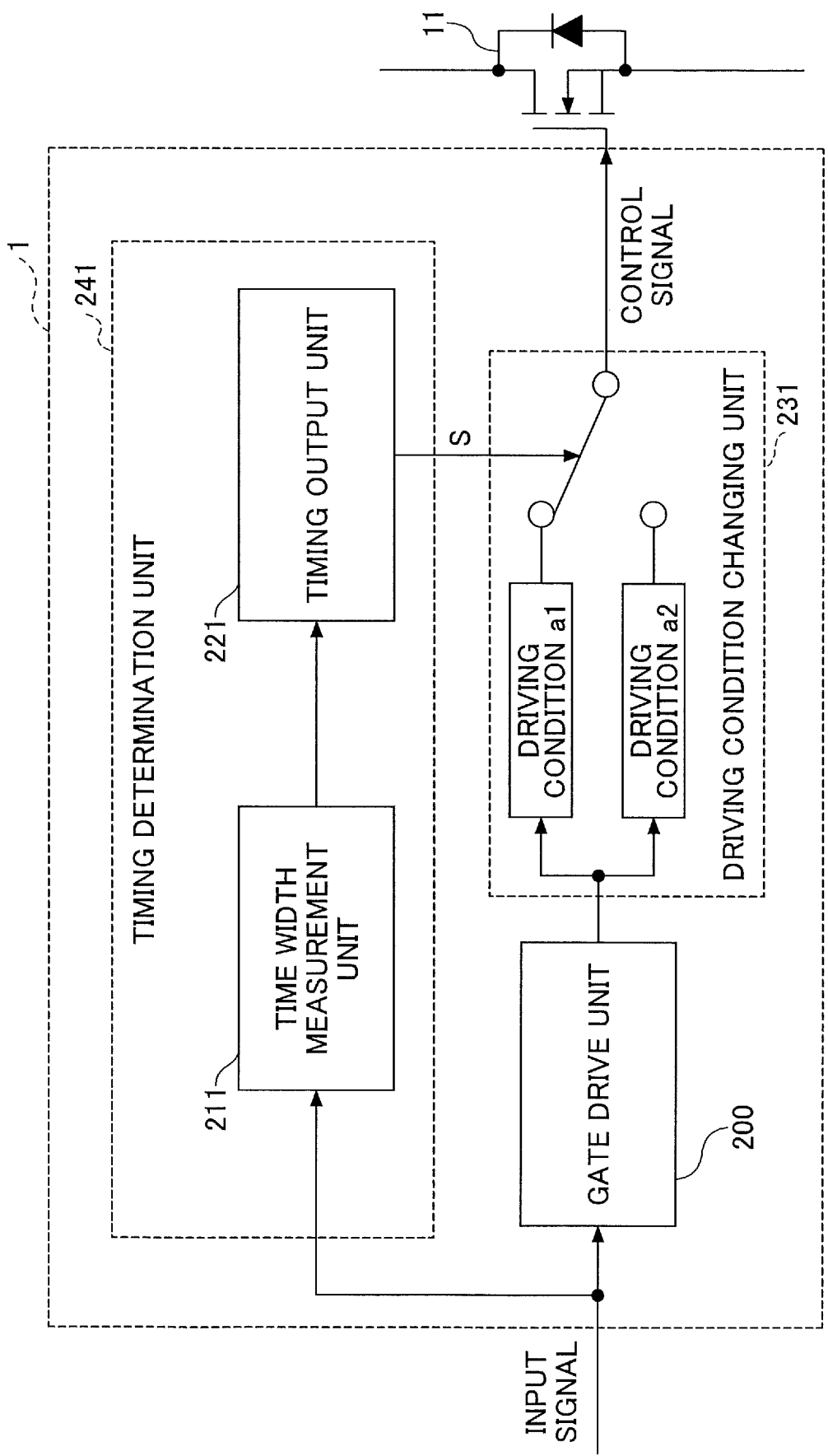
FIG. 1 is a block diagram illustrating a configuration example of a gate driver.

FIG. 1 is a block diagram illustrating a configuration example of a gate driver 1. The gate driver 1 illustrated in FIG. 1 is a circuit that provides positive or negative voltage to a gate of a switching element 11 to turn on/off the gate of the switching element 11. The gate driver 1 drives the gate of the switching element 11 using an active gate driving technique that adjusts switching speed of the switching element 11 during turn-off of the switching element 11.

The switching element 11 is a voltage driven semiconductor element having a control electrode (gate), a first main electrode (collector or drain), and a second main electrode (emitter or source). Examples of the switching element 11 include a metal oxide semiconductor field effect transistor (MOSFET), an insulated gate bipolar transistor (IGBT), and the like. FIG. 1 illustrates a case in which each of the switching element 11 is an N-channel MOSFET.

The switching element 11 may be made of a semiconductor such as Si (silicon), or may be a wide-bandgap device made of a wide-bandgap semiconductor such as SiC (silicon carbide), GaN (gallium nitride), $Ga_2O_3$ (gallium oxide), or diamond. Applying a wide-bandgap device to the switching element 11 enhances an effect of loss reduction of the switching element 11.

The gate driver 1 includes, for example, a gate drive unit 200, a timing determination unit 241, and a driving condition changing unit 231.

The gate drive unit 200 is a circuit unit that drives a gate of the switching element 11 in accordance with an input signal from outside of the gate driver 1. The input signal is a signal that commands switching of the switching element 11, and, for example, is a pulse-width modulated signal (PWM signal). In a case in which a PWM signal is used as the input signal, the input signal at an active level (e.g., a high level) represents an on-command to turn on the switching element 11, and the input signal at an inactive level (e.g., a low level) represents an off-command to turn off the switching element 11.

The timing determination unit 241 measures an on-time width $T_{ON}$ from when the input signal is switched to the on-command to when the input signal is switched to the off-command, and determines, based on the measured on-time width $T_{ON}$, an intermediate timing that is before switch-off surge voltage of the switching element 11 reaches the peak. The intermediate timing tm is a condition changing timing at which the gate driving condition of the switching element 11 is changed during turn-off so that the switching speed of the switching element 11 varies during turn-off.

The timing determination unit 241 includes, for example, a time width measurement unit 211 and a timing output unit 221.

The time width measurement unit 211 measures the on-time width $T_{ON}$ from when the input signal is switched to the on-command to when the input signal is switched to the off-command. The time width measurement unit 211 may be configured to measure the on-time width $T_{ON}$ by a counter or a filter or may be configured to convert the pulse width of the input signal to a voltage value.

The timing output unit 221 outputs a timing signal S to cause the driving condition changing unit 231 to change the gate driving condition of the switching element 11 at the intermediate timing tm in accordance with the on-time width $T_{ON}$ measured by the time width measurement unit 211.

In accordance with the timing signal S output from the timing output unit 221, the driving condition changing unit 231 changes the gate driving condition of the switching element 11 at the intermediate timing tm determined by the timing determination unit 241. Although driving conditions a1 and a2 having different conditions are exemplified as the gate driving conditions in FIG. 1, three or more different driving conditions may be set.

The driving condition changing unit 231 selects one of the driving conditions a1 and a2 in accordance with the timing signal S. For example, the driving condition changing unit 231 selects the driving condition a1 during a period in which the timing signal S is output from the timing determination unit 241, and selects the driving condition a2 during a period in which the timing signal S is not output from the timing determination unit 241.

The driving condition changing unit 231 includes, for example, two gate resistors each having a different resistance value, and a switch circuit that switches whether to connect each gate resistor to the gate of the switching element 11. The resistance value of the gate resistor that is connected to the gate of the switching element 11 when the driving condition a1 is selected is smaller than the resistance value of the gate resistor that is connected to the gate of the switching element 11 when the driving condition a2 is selected.

Accordingly, during turn-off of the switching element 11 by the gate drive unit 200, by selecting the driving condition a1 in which the resistance value of the gate resistor decreases, the switching speed (turn-off speed) of the switching element 11 increases. Therefore, switching losses at the time of turn-off can be reduced. Meanwhile, during turn-off of the switching element 11 by the gate drive unit 200, by selecting the driving condition a2 in which the resistance value of the gate resistor increases, switching speed (turn-off speed) of the switching element 11 decreases. Therefore, a change rate (dI/dt) of drain current flowing through the switching element 11 with respect to time decreases, and switch-off surge voltage can be suppressed.

The driving condition changing unit 231 may also be configured to include two current sources each having a different current value and a switch circuit that switches whether to connect each gate current source to the gate of the switching element 11. The current value of the gate current source connected to the gate of the switching element 11 when the driving condition a1 is selected is greater than the current value of the gate current source connected to the gate of the switching element 11 when the driving condition a2 is selected.

Accordingly, during turn-off of the switching element 11 by the gate drive unit 200, by selecting the driving condition a1 in which the current value of gate current increases, switching speed (turn-off speed) of the switching element 11 increases. Therefore, switching losses at the time of turn-off can be reduced. Meanwhile, during turn-off of the switching element 11 by the gate drive unit 200, by selecting the driving condition a2 in which the current value of gate current decreases, switching speed (turn-off speed) of the switching element 11 decreases. Therefore, a change rate (dI/dt) of drain current flowing through the switching element 11 with respect to time decreases, and switch-off surge voltage can be suppressed.

Here, the intermediate timing tm that is before the switch-off surge voltage of the switching element 11 reaches the peak will be described with reference to FIG. 2 and FIG. 3.

Figure 2:
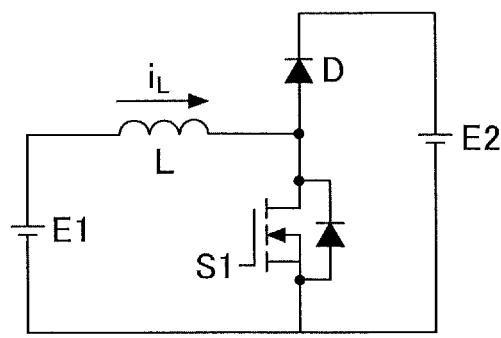
FIG. 2 is a circuit diagram illustrating a configuration of a chopper circuit that is an example of a power converter.

FIG. 2 is a diagram illustrating a configuration of a chopper circuit that is an example of a power converter. FIG. 3 illustrates operation waveforms of a current continuous mode and a current discontinuous mode. In the current continuous mode and the current discontinuous mode, a main current (drain current or collector current) flowing through the semiconductor element S1 is proportional to an input signal (e.g., duty ratio command) to a gate driver that drives a semiconductor element S1 in the power converter. In FIG. 2, E1 indicates an input voltage, E2 indicates an output voltage, L indicates a reactor, and $I_L$ indicates a reactor current. In a case of this booster circuit, because the drain current is equal to the reactor current, the drain current changes according to the following equations.

When S1 is on: $\Delta i_L = E_1/L \times T_{ON}$

When S1 is off: $\Delta i_L = (E_1 - E_2)/L \times T_{OFF}$ $\Delta i_L$ indicates an amount of change in drain current, $T_{ON}$ indicates an on-time of the semiconductor element S1, and $T_{OFF}$ indicates an off-time of the semiconductor element S1. Note that $i_L$ is not less than or equal to 0 due to a diode D.

Figure 3:
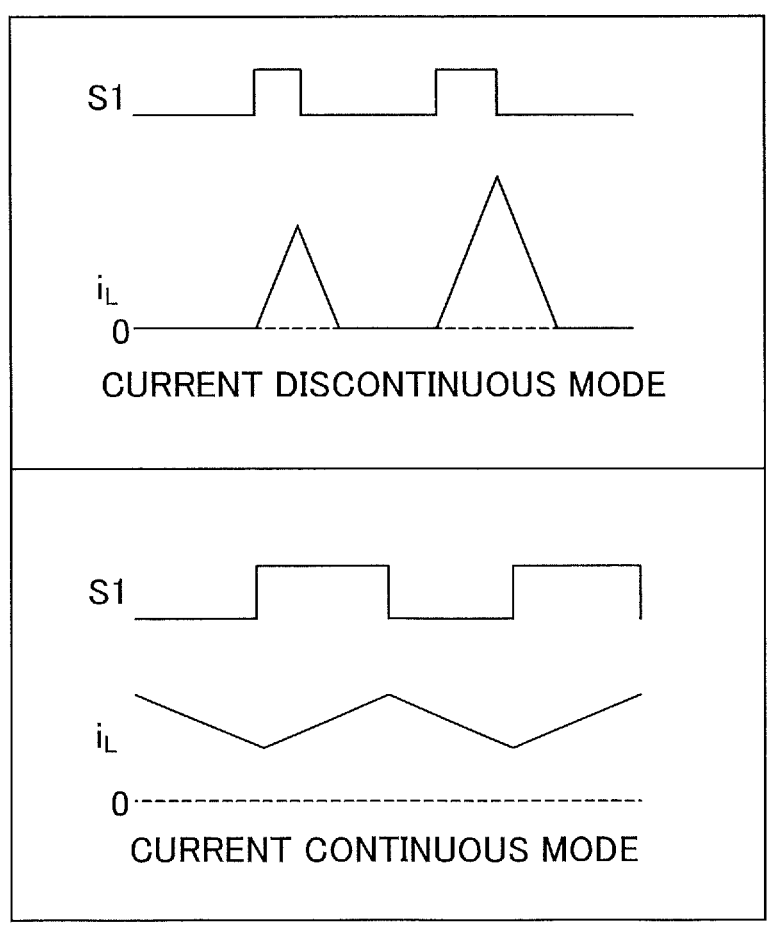
FIG. 3 is a diagram illustrating an example of operation waveforms of a current continuous mode and a current discontinuous mode.

In the current discontinuous mode, as illustrated in FIG. 3, because the reactor current $i_L$ becomes 0 during one cycle of a carrier, the current value of the reactor current $i_L$ (drain current) immediately before the turn-off (in other words, at the start time point of turn-off) depends on the on-time width $T_{ON}$. Therefore, the peak-reaching time from the turn-off start timing of the semiconductor element S1 to the timing at which the switch-off surge voltage becomes the peak value also roughly depends on the on-time width $T_{ON}$.

Therefore, by using the measured value of the on-time width $T_{ON}$, the timing determination unit 241 can determine the intermediate timing tm that is before the switch-off surge voltage of the semiconductor element S1 reaches the peak. The driving condition changing unit 231 changes the gate driving condition of the switching element 11 at the intermediate timing tm determined by the timing determination unit 241. That is, the timing determination unit 241 can determine the intermediate timing tm that is appropriate for varying the switching speed for suppressing the surge voltage and reducing the switching losses. Because the gate driving condition can be changed at an appropriate intermediate timing tm, it is possible to both suppress the surge voltage and reduce the switching losses. By achieving both suppression of the surge voltage and reduction of the switching losses, for example, it is possible to reduce the size and cost of a magnetic element such as a transformer or a reactor, and it is possible to reduce the size of a cooling body of the switching element.

In particular, in the current discontinuous mode, the present current value of the main current at the turn-off start time point may differ from the previous current value of the main current at the turn-off start time point. Therefore, it is advantageous to determine an appropriate timing tm as described above.

Figure 4:
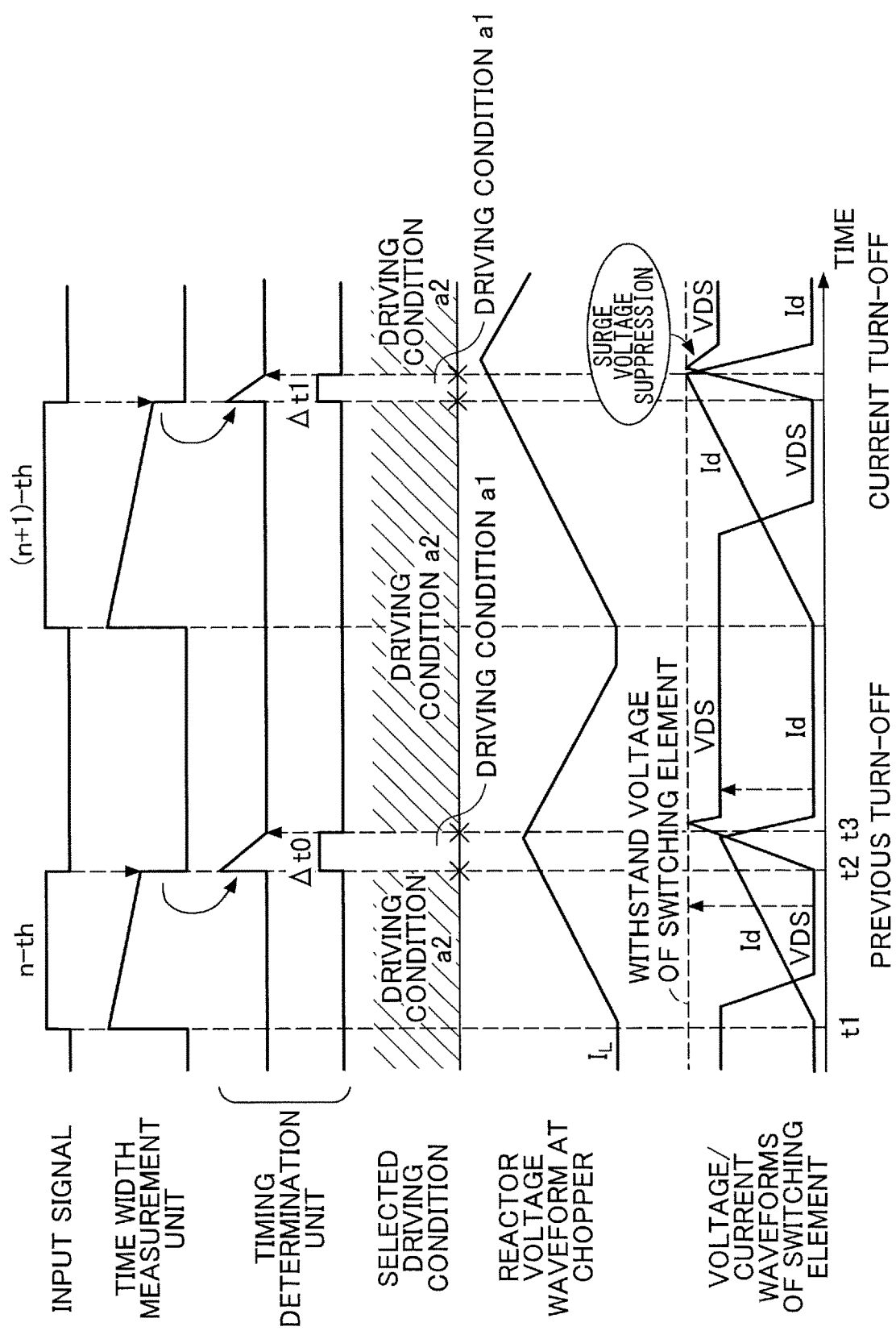
FIG. 4 is a timing chart illustrating a first operation example of the gate driver.

FIG. 4 is a timing chart illustrating a first operation example of the gate driver 1. According to an input signal that causes the switching element 11 to be switched in the current discontinuous mode, the gate drive unit 200 supplies a control signal (gate driving signal) to a control terminal (gate) to the switching element 11 via the driving condition changing unit 231. In this example, the input signal at the high level represents an on-command of the switching element 11, and the input signal at the low level represents an off-command of the switching element 11.

In a case in which the input signal is changed from the off-command to the on-command, the switching element 11 starts turning on in accordance with the control signal input to the control terminal (at time t1). Drain-source voltage VDS of the switching element 11 starts decreasing, and drain current Id starts increasing. The time width measurement unit 211 starts measuring the on-time width $T_{ON}$ of the input signal at the same time as the input signal is changed to the on-command. For example, while the input signal is the on-command, the time width measurement unit 211 down-counts with a predetermined count start value as a start point and converts the on-time width $T_{ON}$ of the input signal to a numerical value or a voltage value.

At this time, the time width measurement unit 211 counts at a counting speed such that the on-time width $T_{ON}$ can be converted to an appropriate intermediate timing tm at which both suppression of surge voltage and reduction of switching losses can be achieved. The counting speed of the time width measurement unit 211 is a value that is set in advance so as to satisfy a relationship X between the on-time width $T_{ON}$ and an appropriate intermediate timing tm at which both suppression of surge voltage and reduction of switching losses can be achieved.

Note that the time width measurement unit 211 may count with a count start value as a start point such that the on-time width $T_{ON}$ can be converted to an appropriate intermediate timing tm at which both suppression of surge voltage and reduction of switching losses can be achieved. At this time, the count start value of the time width measurement unit 211 is a value that is set in advance so as to satisfy a relationship X between the on-time width $T_{ON}$ and an appropriate intermediate timing tm at which both suppression of surge voltage and reduction of switching losses can be achieved.

Thereafter, when the input signal changes from an on-command to an off-command, the switching element 11 starts turning off (at time t2) in accordance with the control signal input to the control terminal. At the same time as the input signal is changed to the off-command, the time width measurement unit 211 stops counting and outputs a signal representing the magnitude of the on-time width $T_{ON}$ of the input signal to the timing output unit 221.

The timing output unit 221 outputs the timing signal S according to the output of the time width measurement unit 211. In FIG. 4, the count value of the time width measurement unit 211 at time t2 when the input signal becomes the off command is the count start value of the timing output unit 221. The timing output unit 221 down-counts at a predetermined constant counting speed and outputs the timing signal S during time period Δt0 to time t3 when the count value becomes zero. Here, t3 corresponds to an appropriate intermediate timing tm at which it is possible to both suppress surge voltage and reduce switching losses.

That is, at t2 when the turn-off operation is started, due to starting outputting the timing signal S, the driving condition is switched from the driving condition a2 to the driving condition a1, and the drain-source voltage VDS starts increasing. Because the driving condition is switched from the driving condition a2 to the driving condition a1, the switching speed increases during the first half of the turn-off period and the switching losses decrease. For example, the driving condition changing unit 231 may increase a resistance value of the gate resistor connected to the gate of the switching element 11 at time t2, or may decrease a current value of the gate current flowing into the gate of the switching element 11 at time t2.

Then, upon the miller plateau region of the switching element 11 ending (at time t3), at the time of the drain current starting rapidly decreasing, the surge voltage corresponding to the change rate of the drain current with respect to time occurs. However, by the count value of the timing output unit 221 becoming zero, the output of the timing signal S stops. Accordingly, because the gate driving condition is switched from the driving condition a1 to the driving condition a2 at time t3, the switching speed during the second half of the turn-off period is reduced, and the switch-off surge voltage can be suppressed. For example, the driving condition changing unit 231 may increase a resistance value of the gate resistor connected to the gate of the switching element 11 at time t3, or may decrease a current value of the gate current flowing into the gate of the switching element 11 at time t3.

As described above, the time width measurement unit 211 outputs the count value corresponding to the on-time width $T_{ON}$ by counting from when the input signal is switched to an on-command to when the input signal is switched to an off-command. The timing output unit 221 changes, in accordance with the count value, the length of the period Δt0 during which the timing signal S is output. Thus, even if the length of the on-time width $T_{ON}$ varies with each turn-off timing, an appropriate timing tm can be set so that both suppression of surge voltage and reduction of switching losses can be achieved. For example, as illustrated in FIG. 4, at the next ((n+1)-th) switching timing, even when the length of the on-time width $T_{ON}$ becomes longer than that of the present (n-th) switching timing, the length of the period Δt1 for outputting the timing signal S can be reduced. Thereby, it is possible to set the appropriate timing tm.

Also, the intermediate timing tm is the timing t3 within the period of the off-command adjacent to the measured on-time width $T_{ON}$. Therefore, even in the current discontinuous mode, it is possible to set the intermediate timing tm that is appropriate for the magnitude of the drain current that flows at the previous on-time width $T_{ON}$.

Figure 5:
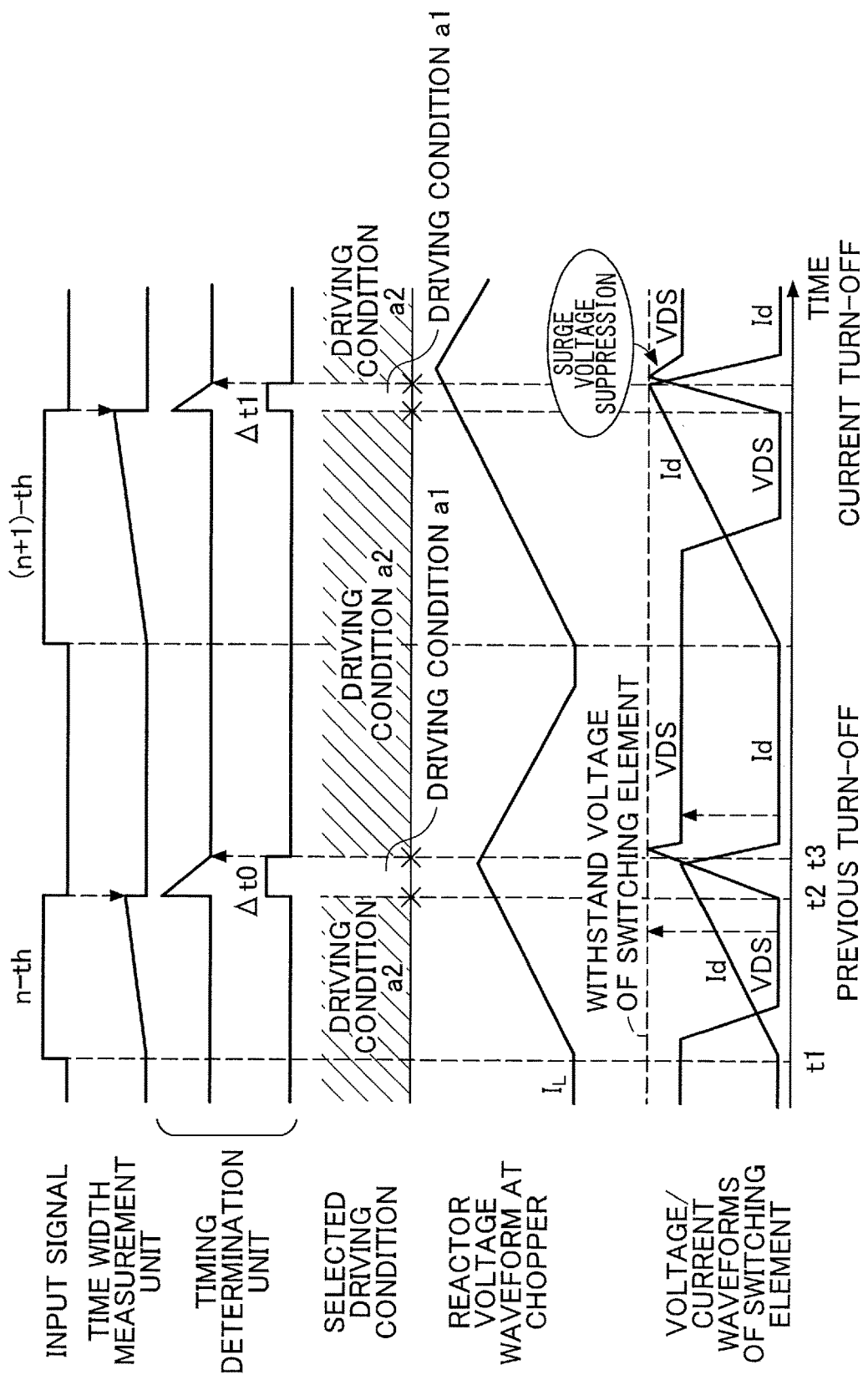
FIG. 5 is a timing chart illustrating a second operation example of the gate driver.

FIG. 5 is a timing chart illustrating a second operation example of the gate driver 1. Because operations other than processes between the time width measurement unit 211 and the timing output unit 221 are the same as the first operation example, the description thereof is omitted or simplified by incorporating the above-described description. In the first operation example, the time width measurement unit 211 counts based on the relationship X, while in the second operation example, the timing output unit 221 counts based on the relationship X. They differ in this respect.

In a case in which the input signal is changed from the off-command to the on-command, the switching element 11 starts turning on in accordance with the control signal input to the control terminal (at time t1). The time width measurement unit 211 starts measuring the on-time width $T_{ON}$ of the input signal at the same time as the input signal is changed to the on-command. For example, while the input signal is the on-command, the time width measurement unit 211 down-counts with a predetermined count start value (which is 0, in this case) as a start point and converts the on-time width $T_{ON}$ of the input signal to a numerical value or a voltage value.

At this time, the time width measurement unit 211 does not have to count at a counting speed that enables to convert the on-time width $T_{ON}$ to an appropriate intermediate timing tm at which both suppression of surge voltage and reduction of switching losses can be achieved. For example, the counting speed of the time width measurement unit 211 may be a value that is set in advance in accordance with an actual passage of time.

Thereafter, when the input signal changes from an on-command to an off-command, the switching element 11 starts turning off (at time t2) in accordance with the control signal input to the control terminal. At the same time as the input signal is changed to the off-command, the time width measurement unit 211 stops counting and outputs a signal representing the magnitude of the on-time width $T_{ON}$ of the input signal to the timing output unit 221.

The timing output unit 221 outputs the timing signal S according to the output of the time width measurement unit 211. For example, with reference to a relationship between the on-time width $T_{ON}$ and the intermediate timing tm, at which both suppression of surge voltage and reduction of switching losses can be achieved, the timing output unit 221 outputs, in accordance with the on-time width $T_{ON}$ measured by the time width measurement unit 211, the timing signal S so as to satisfy the relationship.

In FIG. 5, as a first example, the count value of the time width measurement unit 211 at time t2 when the input signal becomes the off-command is the count start value of the timing output unit 221. The timing output unit 221 down-counts at a counting speed corresponding to the count value of the time width measurement unit 211 at time t2 when the input signal becomes off, and outputs the timing signal S during time period Δt0 to time t3 when the count value becomes zero. Here, t3 corresponds to an appropriate intermediate timing tm at which it is possible to both suppress surge voltage and reduce switching losses. That is, the timing output unit 221 outputs the timing signal S during the period from the start to the end of counting at the counting speed corresponding to the on-time width $T_{ON}$ measured by the time width measurement unit 211.

At this time, the counting speed of the timing output unit 221 is a value that is set sequentially in accordance with the on-time width $T_{ON}$ measured for each turn-on operation so as to satisfy the relationship X between the on-time width $T_{ON}$ and the appropriate intermediate timing tm at which both suppression of surge voltage and reduction of switching losses can be achieved. For example, the timing output unit 221 determines, based on the relationship X, the counting speed corresponding to the on-time width $T_{ON}$ measured by the time width measurement unit 211 and outputs the timing signal S during the period from the start to the end of counting at the determined counting speed.

Alternatively, in FIG. 5, as a second example, the timing output unit 221 may down-count with a count start value as a start point corresponding to the count value of the time width measurement unit 211 at time t2 when the input signal becomes off. In this case, the counting speed of the timing output unit 221 may be a predetermined constant value and is a value that is set in advance in accordance with an actual passage of time, for example. That is, the timing output unit 221 outputs the timing signal S during the period from the start to the end of counting at the counting speed corresponding to the on-time width $T_{ON}$ measured by the time width measurement unit 211.

At this time, the count start value of the timing output unit 221 is a value that is set sequentially in accordance with the on-time width $T_{ON}$ measured for each turn-on operation so as to satisfy the relationship X between the on-time width $T_{ON}$ and the appropriate intermediate timing tm at which both suppression of surge voltage and reduction of switching losses can be achieved. For example, the timing output unit 221 determines, based on the relationship X, the count start value corresponding to the on-time width $T_{ON}$ measured by the time width measurement unit 211 and outputs the timing signal S during the period from the start to the end of counting at the determined count star value.

That is, at t2 when the turn-off operation is started, due to starting outputting the timing signal S, the driving condition is switched from the driving condition a2 to the driving condition a1, and the drain-source voltage VDS starts increasing. Because the driving condition is switched from the driving condition a2 to the driving condition a1, the switching speed increases during the first half of the turn-off period and the switching losses decrease.

Then, upon the miller plateau region of the switching element 11 ending (at time t3), at the time of the drain current starting rapidly decreasing, the surge voltage corresponding to the change rate of the drain current with respect to time occurs. However, by the count value of the timing output unit 221 becoming zero, the output of the timing signal S stops. Accordingly, because the gate driving condition is switched from the driving condition a1 to the driving condition a2 at time t3, the switching speed during the second half of the turn-off period is reduced, and the switch-off surge voltage can be suppressed.

In this manner, in a case in which the counting speed of the time width measurement unit 211 is not a value that is previously set to satisfy the above described relationship X, the count start value or the counting speed of the timing output unit 221 may be changed in accordance with the on-time width $T_{ON}$ measured by the time width measurement unit 211. At this time, the timing output unit 221 may determine the count start value or the counting speed on a case-by-case basis in accordance with an appropriate timing tm for changing the driving condition with respect to the on-time width $T_{ON}$ measured by the time width measurement unit 211. Note that the method of referring to the relationship X described above may be another method.

Although the gate driver and the power converter have been described with reference to the embodiment, the present invention is not limited to the embodiment described above. Various modifications and enhancements, such as combinations and substitutions with some or all of the other embodiments, are possible within the scope of the present invention.

For example, a power converter including at least one gate driver is not limited to a DC-DC converter that converts direct current to another direct current. Specific examples of the power converter include an inverter for converting direct current to alternating current, a step-up converter for increasing an input voltage and outputting the increased voltage, a step-down converter for decreasing an input voltage magnitude and outputting the decreased voltage, and a buck-boost converter for increasing or decreasing an input voltage and outputting the increased or decreased voltage.

For example, functional elements as described above may be realized by a memory that stores at least one program and by a processor coupled to the memory.

What is claimed is:

1. A gate driver comprising:
    a timing determination unit configured to measure an on-time of a switching element and configured to determine, based on the on-time, a certain timing during a turn-off period of the switching element as an intermediate timing; and
    a driving condition changing unit configured to change a gate driving condition of the switching element at the intermediate timing determined by the timing determination unit.

2. The gate driver according to claim 1, wherein the driving condition changing unit is configured to decrease a current value of gate current flowing into a gate of the switching element at the intermediate timing.

3. The gate driver according to claim 1, wherein the switching element is a wide-bandgap device.

4. A power converter comprising:
    the gate driver according to claim 1 and
    the switching element.

* * * * *